United States Patent
Kirkpatrick

(10) Patent No.: US 7,227,349 B2
(45) Date of Patent: Jun. 5, 2007

(54) METHOD AND APPARATUS FOR THE DIGITAL AND ANALOG TRIGGERING OF A SIGNAL ANALYSIS DEVICE

(75) Inventor: Donald C. Kirkpatrick, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 605 days.

(21) Appl. No.: 10/316,548

(22) Filed: Dec. 10, 2002

(65) Prior Publication Data

US 2003/0154452 A1     Aug. 14, 2003

Related U.S. Application Data

(60) Provisional application No. 60/356,453, filed on Feb. 11, 2002.

(51) Int. Cl.
    *G01R 13/20*     (2006.01)
(52) U.S. Cl. ............................. 324/158.1; 324/121 R; 324/73.1
(58) Field of Classification Search ............ 324/121 R, 324/158.1, 76.11, 73.1; 702/66–68, 108; 714/724
    See application file for complete search history.

(56) References Cited

U.S. PATENT DOCUMENTS

| | | | |
|---|---|---|---|
| 4,441,183 A * | 4/1984 | Dussault | 714/732 |
| 5,235,270 A * | 8/1993 | Shimada et al. | 324/121 R |
| 6,421,619 B1 * | 7/2002 | Daniels et al. | 702/66 |
| 6,847,199 B2 * | 1/2005 | Kaufman et al. | 324/73.1 |

FOREIGN PATENT DOCUMENTS

| | | |
|---|---|---|
| JP | 03162677 | 7/1991 |
| JP | 08015329 | 1/1996 |
| JP | 11051974 | 2/1999 |

* cited by examiner

*Primary Examiner*—Vinh P. Nguyen
(74) *Attorney, Agent, or Firm*—Moser, Patterson & Sheridan, LLP; Francis I. Gray; Thomas F. Lenihan

(57) ABSTRACT

A method and apparatus enabling the analog and digital triggering of a signal analysis device such as a Logic Analyzer, wherein separate analog and digital signal paths provide separate analog and digital processing of an input test signal for enabling the triggering of a signal analysis device upon analog and digital signal conditions.

17 Claims, 2 Drawing Sheets

METHOD AND APPARATUS FOR THE DIGITAL AND ANALOG TRIGGERING OF A SIGNAL ANALYSIS DEVICE

CROSS REFERENCE TO RELATED APPLICATIONS

This patent application is related to U.S. Provisional Patent Application No. 60/356,453 filed Feb. 11, 2002, which is herein incorporated by reference in its entirety.

TECHNICAL FIELD

The invention relates generally to the field of signal analysis and, more specifically, to a method and apparatus for the digital and analog triggering of a signal analysis.

BACKGROUND OF THE INVENTION

Signal analysis devices such as Logic Analyzers, digital storage oscilloscopes (DSOs) and the like, are utilized to monitor the signal activity in a wide variety of systems. For example, Logic Analyzers provide the capability to monitor the logical activity of a digital system. The Logic Analyzer is an instrument having, typically, dozens of input channels, a relatively large memory and the ability to disassemble/decode bus states and phases. Typically, a Logic Analyzer is electrically coupled to a device or system under test via a hardware interface to capture data while the device or system under test steps through a process. The Logic Analyzer tests for a preset condition or trigger to control the recording or processing of the signals generated by the device or system under test. The conditions or triggers used for Logic Analyzers are typically digital representations of events.

One problem with present digital signal analysis devices, such as Logic Analyzers, is that they capture data at a very low level of detail. The low detail level makes it difficult to correlate analog signal anomalies with analyzer data, thereby inhibiting the search for the root cause of an analog anomaly within the collected analyzer data.

In an attempt to correct for this shortcoming, some Logic Analyzers include "oscilloscopes on a board" that plug into the Logic Analyzer mainframe. These oscilloscopes are separate instruments that are contained in the same enclosure as the Logic Analyzer. In such combination instruments, in order to trigger on analog events (e.g., a runt signal), the user must attach two probes to the same point. The first probe is the digital logic probe for the Logic Analyzer and the second probe is the analog probe for the device under test. Such connection is necessary because the analog-to-digital conversion for the Logic Analyzer is performed in the probe tip. A trigger out signal from the scope unit must then be connected to the Logic Analyzer external trigger input.

Utilizing such combination instruments though, leads to increased costs, a larger form factor and timing differences which can result in measurement inaccuracy.

SUMMARY OF THE INVENTION

These and other deficiencies of the prior art are addressed by the present invention of a method and apparatus for the digital and analog triggering of signal analysis devices. The separate analog and digital signal paths provide a means for processing an input test signal and evaluating the test signal for both preset analog conditions and preset digital conditions to generate respective analog and digital trigger signals in a signal analysis device.

The subject invention is adapted, in one embodiment, to an apparatus having a probe providing a common path for inputting either analog signals and/or digital signals from a circuit under test to the instrument, and a common node at which the input test signals are received and directed in parallel to a digital path and an analog path. The digital path is coupled to the node for receiving and processing the input test signals, wherein a digital trigger circuit is coupled to the digital path for evaluating the processed digital signals for preset digital conditions and generating a digital control trigger upon detection of the preset digital conditions. The analog path is coupled to the node for receiving and processing the input test signals, wherein an analog trigger circuit is coupled to the analog path for evaluating the processed analog signals for preset analog conditions and generating an analog control trigger upon detection of the preset analog conditions.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

Figure 1:
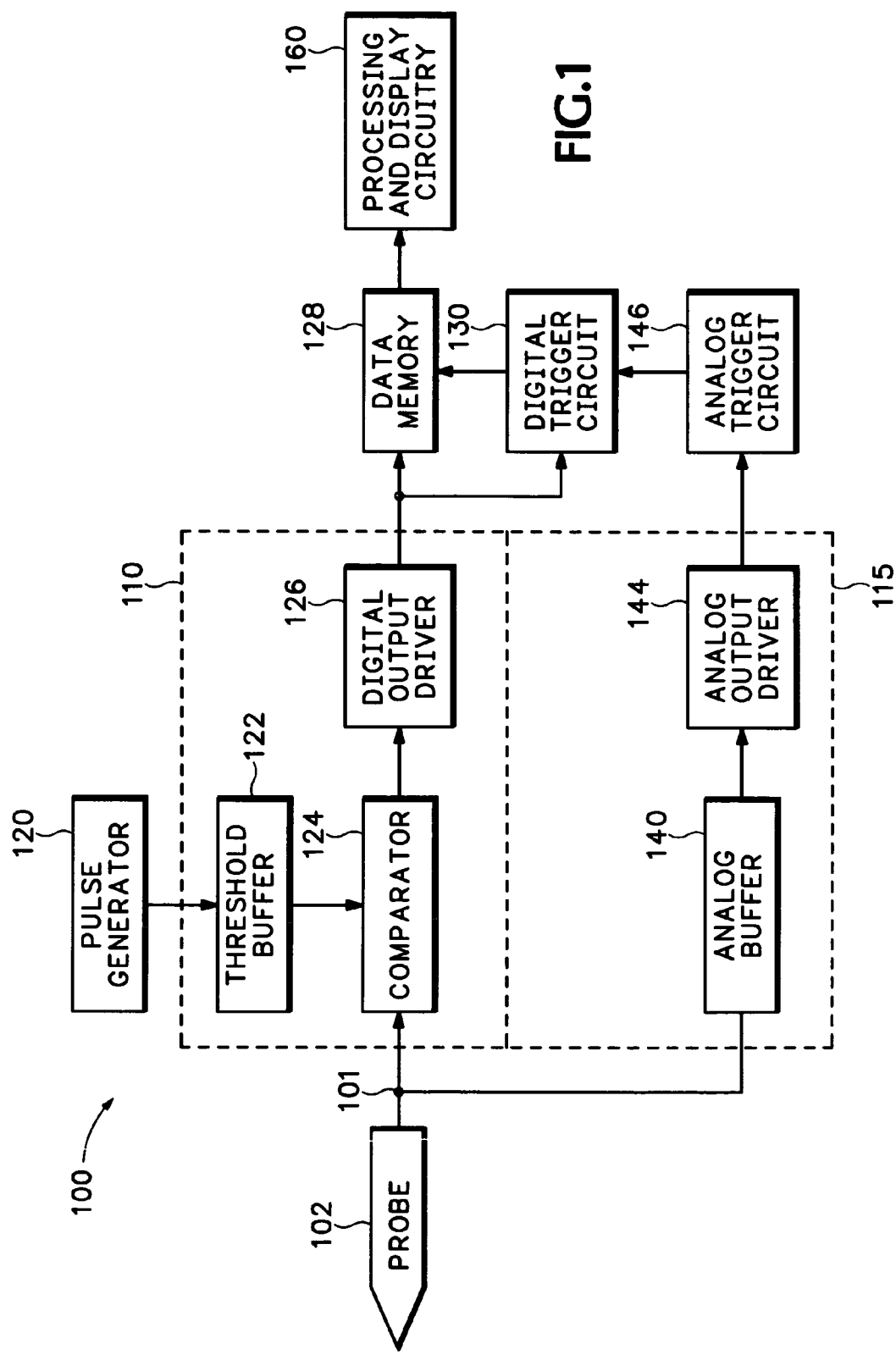
FIG. 1 depicts a high level block diagram of a Logic Analyzer according to an embodiment of the present invention.

The subject invention will be primarily described within the context of a single-channel, digital signal analysis device such as a Logic Analyzer (LA). However, it will be appreciated by those skilled in the art that the invention may be advantageously employed in any single-channel or multi-channel signal measurement or analysis device in which both digital and analog triggering is desirable. FIG. 1 depicts a high level block diagram of a Logic Analyzer 100 according to an embodiment of the present invention. The Logic Analyzer 100 of FIG. 1 takes advantage of a significant advance in a new Logic Analyzer disclosed in commonly-assigned U.S. Pat. No. 6,847,199 issued Jan. 25, 2005, which is herein incorporated by reference in its entirety and which discloses an arrangement whereby a signal under test can be conveyed to the input of a Logic Analyzer in analog form.

The Logic Analyzer 100 of FIG. 1 comprises a single data acquisition probe 102, a common node 101, a data memory 128, a digital trigger circuit 130, an analog trigger circuit 146, and two signal paths; namely a Digital signal path 110 and an Analog signal path 115.

The Digital signal path 110 is formed using a Comparator 124, a Digital Output Driver 126 and a threshold buffer 122. The Analog signal path 115 is formed using an Analog Buffer 140 and an Analog Output Driver 144.

A test signal from a device under test is typically an analog signal comprising one of two voltage levels (e.g., 0 v and 3 v, or 0 v and 5 v) directed to represent either a low logic level or a high logic level, respectively, using a positive logic format. This test signal is received by the probe 102 and communicated to the Digital signal path 110 and the Analog signal path 115 via the common node 101.

Briefly stated, the Digital signal path 110 provides a digital representation of the test signal to the digital trigger circuit 130. The digital trigger circuit 130 enables the Logic Analyzer 100 to trigger (control the recording of data signals in a data memory) upon the identification of a preset digital condition(s). The Analog signal path 115 provides an analog representation of the test signal to the analog trigger circuit 146. The analog trigger circuit 115 enables the Logic Analyzer 100 to trigger (control the recording of data signals in a data memory) upon the identification of a preset analog condition(s). The output of the Logic Analyzer 100 is then be communicated to a processing and display device 160 or otherwise processed.

In more detail, a test signal from the probe 102 is communicated to the Digital signal path 110 and is coupled to a first input of the Comparator 124. The Comparator 124 is a two input amplifier with high gain and a differential output. Illustratively, the first input to the Comparator 124 is from the probe 102. A second input to the Comparator 124 is coupled to a threshold level voltage from, illustratively, an external pulse generator 120 (and further conditioned by the Threshold Buffer 122). The threshold level voltage from the external pulse generator 120 is adjusted by the Threshold Buffer 122 to be substantially equivalent to the voltage at the tip of the probe 102. The gain and offset of the Threshold Buffer 122 are adjusted by, illustratively, 7 bits in a control register. The range of values in the control register varies between 0 and 127.

The values in the control register are selected to represent specific desired results. For example, the value 63 sets the gain of the Threshold Buffer 122 at −1/10. Increasing the value raises the gain by up to 15% and decreasing the value lowers the Gain by up to 15%. The value 63 sets the offset to zero at the output of the Threshold Buffer 122. The value of 0 sets the Buffer output 13 mV more negative than normal. The value of 126 sets the Buffer 13 mV more positive than normal. The output of the Threshold Buffer 122 then drives the Comparator 124.

The Comparator 124 compares the test signal voltage (probe voltage) and the threshold level voltage. If the probe voltage is greater than the adjusted threshold voltage, then the output of the Comparator 124 goes to a digital high logic state. The output of the Comparator 124 is coupled to the Digital Output Driver 126.

The Digital Output Driver 126 is, illustratively, a differential non-inverting digital buffer whose output has high drive capability. The Digital Output Driver 126 optionally provides a selectable propagation delay. In an alternate embodiment, the propagation delay is provided by a Delay Select element that is a separate element of the Logic Analyzer. One bit of a register selects the propagation delay of the Digital Output Driver 126. For example, a value of 0 imparts a minimum (e.g., 0 ps) delay while a value of 1 imparts a maximum (e.g., 62 ps) delay relative to the total propagation delay of the Digital signal path 110. The output of the Digital Output Driver 126 is then applied to the data memory 128 and the digital trigger circuit 130 substantially simultaneously. The digital trigger circuit 130 evaluates the digital data from the Digital Output Driver 126 for preset conditions (triggers), to control the recording of data signals in the data memory 128. Digital trigger circuits and digital trigger conditions, such as those of conventional Logic Analyzers, are well known to those skilled in the art and will not be described in detail herein.

Referring now to the Analog signal path 115, the Analog signal path 115 receives the test signal from the probe 102. The test signal is input to a selectable gain Analog Buffer 140. The Analog Buffer 140 is, illustratively, a differential amplifier with selectable gains. The gains of the Analog Buffer 140 may be set to 0 (off/power down), 1, 2, or 3 (maximum gain) by two bits in a control register. In one embodiment, the output signal of the Analog Buffer 140 is a varying current not a voltage.

The gain of the Analog Buffer 140 is set in its input stage by two differential amplifier pairs connected in parallel. One differential amplifier pair is designed to give a gain of one and the other differential amplifier pair is designed to give a gain of two (set by, for example, an emitter resistor value). One amplifier or the other is turned on at a time to give a gain of one or two. Both amplifiers are turned on at once to give a gain of three. The gain of three is achieved because the output currents of the two differential amplifier pair sum together.

The control of the gain of the Analog Buffer 140 is done with 2 bits (B_GAIN) of an Analog Path Control Register. Three control lines are decoded by control logic from these 2 bits. Each differential amplifier pair is turned on and off by a respective one of these 2 bits. The third bit is used to turn the power on or off to the Analog Buffer. If the B_GAIN register is loaded with the number 0, then the power is turn off. For any other value of B_GAIN the power is turned on. If B_GAIN=1, then the gain-of-one diff pair is on and the gain-of-two diff pair is off. The opposite is true if B_GAIN=2. Both diff pair amplifiers are on if B_GAIN=3.

The output signal currents of the Analog Buffer 140 are routed to an analog bus by a switching circuit in the Analog Buffer 140 that allows this signal to drive any one of a possible plurality of buses at a time. The limiting capabilities of the Analog Buffer 140 is accomplished by reserving only two bits of a register to control which bus is to be driven and some decoding logic. The possibility of a plurality of buses is realized in the case of a Logic Analyzer with multiple input channels. The Analog Buffer may encompass many embodiments, such as an Analog Buffer with the capability of controlling a plurality of output buses, and still be incorporated within the teachings of the present invention. The output signal of the Analog Buffer 140 drives the Analog Output Driver 144

The Analog Output Driver 144 is, illustratively, a non-inverting amplifier that has high drive capability. It has a differential current input and a single ended voltage output. The gain and offset of the Analog Output Driver 144 may be adjusted by 7 bits of a control register. The range of values in these registers is 0 to 127. The value 63 sets the Gain at nominal. (Nominal is overall analog path gain of about one with the Buffer gain set to 1 and the Analog Output Driver 144 terminated by 50 to 75 ohms.) The gain range is +/−18% around this nominal gain. Increasing the register value raises the Gain. The value 63 sets the Offset to zero relative to the signal (centered). The value 0 in the register moves the amplifiers output −16 mV and the value 126 moves the amplifier output +16 mV if the output is terminated by 50 ohms. (Offset range is +/−19 mV if terminated by 75 ohms.) The gain and offset adjustments are needed to make up for errors in the overall signal path. Some of these errors are: Probe gain and offset, Probe output impedance, Probe coaxial cable impedance, Receiver input termination mismatch, and Analog Path gain and offset errors. The Analog Output Driver 144 can be turned off (powered down) if it is not used. For example, if an OUT_On bit in the Analog Output Driver 144 is set to 0, then the amplifier is off. If the bit is set to 1, the amplifier is on.

The output of the Analog Output Driver 144 is applied to the analog trigger circuit 146. The analog trigger circuit 146 of the Logic Analyzer 100 of FIG. 1 evaluates the analog data from the Analog Output Driver 144 for preset conditions (triggers). Upon detecting such condition(s), a trigger signal from the analog trigger circuit 146 is sent to the digital trigger circuit 130 to cause the digital trigger circuit 130 to begin or continue recording data signals in the data memory 128. Similarly, another trigger signal from the analog trigger circuit 146 may be sent to the digital trigger circuit 130 to end the recording of data in the data memory 128. Analog trigger circuits and analog trigger conditions, such as the circuits and trigger conditions used in conventional oscilloscopes, are well known to those skilled in the art. For example, some typical analog trigger conditions include runts, glitches, threshold violations, overshoot, ringing, pulse width too high, and pulse width too low conditions.

Various embodiments of analog and digital trigger combinations may be readily devised for controlling the recording of data by a Logic Analyzer that still incorporate these teachings. For example, an analog trigger may be employed to begin the recording of data by a Logic Analyzer in accordance with the present invention, while a subsequent digital trigger may be employed to end the recording session and vice-versa.

Figure 2:
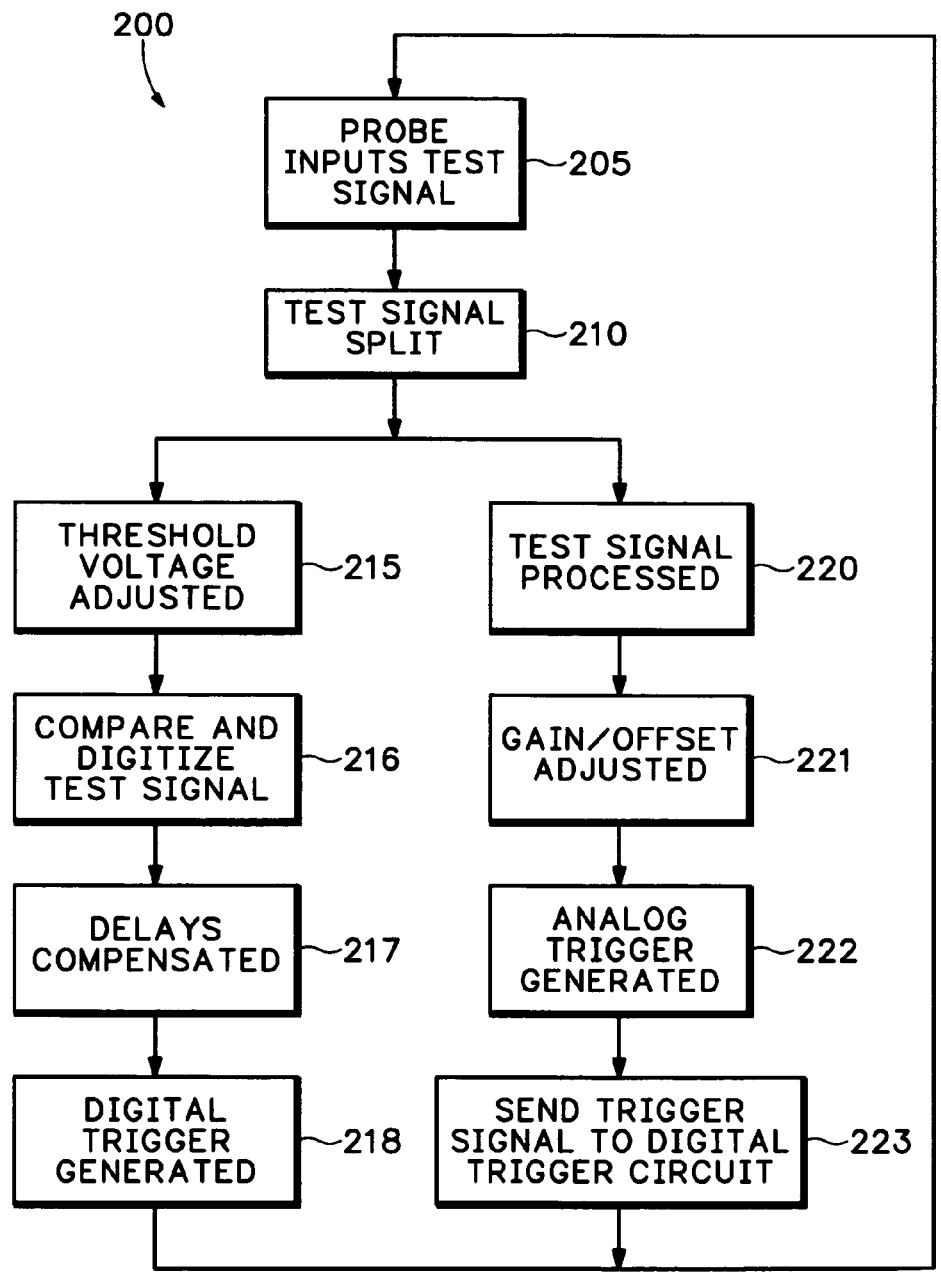
FIG. 2 depicts a flow diagram of a method according to an embodiment of the present invention.

FIG. 2 depicts a flow diagram of a method according to the present invention. The method 200 is entered at step 205, as a test signal from a device under test enters a data acquisition probe such as the probe 102 of FIG. 1.

At step 210, the test signal from the data acquisition probe 102 of step 205 is directed at a common node into a digital signal path 110 and an analog signal path 115. For example, the test signal from the probe 102 of FIG. 1, is directed at common node 101 into the Digital signal path 110 and the Analog signal path 115. The method 200 then proceeds simultaneously to steps 215 (for the digital signal path) and 220 (for the analog signal path). The method 200 will be described referring to digital signal path steps 215–218 and then the analog signal path steps 220–222. The signal under test can travel substantially simultaneously along the digital signal path and analog signal path.

At step 215, a threshold level voltage from the external pulse generator 120 is adjusted by the threshold buffer 122. That is, at step 215 the threshold level voltage is adjusted by the threshold buffer 122 to be substantially equivalent to the voltage at the tip of the data acquisition probe 102.

At step 216, the adjusted threshold level voltage from the threshold buffer 122 and the test signal from the data acquisition probe 102 are input into the comparator 124 to be evaluated. That is, at step 216, the comparator 124 compares the test signal voltage (probe voltage) and the adjusted threshold level voltage and, if the probe voltage is greater than the adjusted threshold voltage, then the output of the comparator produces a first logical state (i.e., a logical high). Conversely, if the probe voltage is less than the adjusted threshold voltage, then the output of the comparator 124 produces a second logical state (i.e., a logical low). As such, the test signal is digitized.

At step 217, the output of the Comparator 124 is processed by a Digital Output Driver 126. That is at step 317, the Digital Output Driver 126 adds a delay to the digitized signal relative to the total propagation delay of the Digital signal path 110.

At step 218, the output of the Digital Output Driver 126 is applied simultaneously to the data memory 128 and to the digital trigger circuit 130. The digital trigger circuit 130 evaluates the digital data from the Digital Output Driver 126 for preset conditions (triggers), to control the recording of data signals in the data memory 128. The method 200 is then exited.

Referring now to the analog signal path 115, at step 220 the test signal from the data acquisition probe 102 is provided to the selectable gain analog buffer 140 in the analog signal path. That is, at step 220, the analog buffer 140 processes the test signal from the probe 102 creating an analog representation of the test signal to be input into the analog output driver 144. (In an embodiment of a Logic Analyzer having a plurality of input channels, the analog buffer 140 selectively couples one of the plurality of analog input signals to an output terminal to be sent to the analog output driver 144.)

At step 221, the output of the analog buffer 140 is applied to the analog output driver 144. The gain and offsets of the analog output driver 144 are adjusted to make up for errors in the overall signal path.

At step 222, the output of the Analog Output Driver 144 is processed by the analog trigger circuit 146. The analog trigger circuit 146 evaluates the signal from the Analog Output Driver 144 for preset conditions (triggers). The method 200 then proceeds to step 223.

At step 223, the analog trigger circuit 146, upon detecting a trigger condition, sends a trigger signal to the digital trigger circuit 130 of step 218 to cause the digital trigger circuit to control the recording of data signals in the data memory 128. The method 200 is then exited.

In an alternate embodiment, a trigger output of the analog trigger circuit 146 may be coupled directly to the data memory 128 to control the recording of data signals in the data memory.

Although various embodiments, which incorporate the teachings of the present invention have been shown and described in detail herein, those skilled in the art can readily devise many other varied embodiments that still incorporate these teachings.

What is claimed is:

1. A test and measurement instrument, comprising:
   an input conductor for receiving input test signals from a device under test, said input test signals being directed in parallel to a digital path and an analog path;
   said digital path processing said input test signals to create a digital representation of said input test signals;
   said analog path processing said input test signals to create an analog representation of said input test signals;
   a digital trigger circuit coupled to said digital path for evaluating said processed digital signals for preset digital conditions and generating a digital control trigger upon detection of said preset digital conditions; and
   an analog trigger circuit coupled to said analog path for evaluating said processed analog signals for preset analog conditions and generating an analog control trigger upon detection of said preset analog conditions, the analog control trigger being coupled to the digital trigger circuit so that said digital representation is captured in an acquisition memory in response to both said preset digital and analog conditions.

2. The test and measurement instrument of claim 1, further comprising a common node wherein said test signals from said input conductor are directed in parallel to said digital trigger circuit and said analog trigger circuit.

3. The test and measurement instrument of claim 1, wherein said input test conductor is a probe.

4. The test and measurement instrument of claim 3, wherein said probe is capable of receiving at least one of analog test signals and digital test signals.

5. The test and measurement instrument of claim 1, wherein said preset digital conditions are digital trigger words.

6. The test and measurement instrument of claim 1, wherein said preset analog conditions are analog trigger words.

7. The test and measurement instrument of claim 6, wherein said analog trigger words are selected from the group consisting of runts, glitches, threshold violations, overshoot, ringing, pulse width too high, and pulse width too low conditions.

8. The test and measurement instrument of claim 1, wherein said digital path comprises a comparator for determining a logic state of said input test signals and producing a digital representation of said input test signals.

9. The test and measurement instrument of claim 1, wherein said analog path comprises an analog buffer for producing an analog representation of said input test signals.

10. The test and measurement instrument of claim 1, wherein said digital control trigger from said digital trigger circuit is operable for controlling the recording of said digital representation in said acquisition memory.

11. A method, comprising:
   processing an input test signal to create a digital representation of said input test signal;
   processing said input test signal to create an analog representation of said input test signal;
   generating a digital trigger in response to said digital representation favorably comparing to at least one preset digital condition; and
   generating an analog trigger in response to said analog representation favorably comparing to at least one preset analog condition, said digital and analog triggers being coupled to capture said digital representation in an acquisition memory.

12. The method of claim 11, further comprising:
   receiving said input test signal via a common path.

13. The method of claim 12, wherein said test signal is provided to said common path via an input conductor.

14. The method of claim 12, wherein said input conductor is a probe.

15. The method of claim 11, further comprising:
   controlling the recording of said digital representation in said acquisition memory in response to a favorable comparison of said digital representation.

16. The method of claim 11, further comprising:
   controlling the recording of said digital representation in said acquisition memory in response to a favorable comparison of said analog representation.

17. The method of claim 11, further comprising:
   generating said digital control trigger in said digital path in response to said analog control trigger.

* * * * *